United States Patent
Bonaccio et al.

(10) Patent No.: US 8,587,464 B2
(45) Date of Patent: Nov. 19, 2013

(54) OFF-LINE GAIN CALIBRATION IN A TIME-INTERLEAVED ANALOG-TO-DIGITAL CONVERTER

(75) Inventors: Anthony R. Bonaccio, Shelburne, VT (US); Frank R. Keyser, III, Colchester, VT (US); Martin L. Schmatz, Rueschlikon (CH); Benjamin T. Voegli, Burlington, VT (US)

(73) Assignee: International Business Machines Corporation, Armonk, NY (US)

(*) Notice: Subject to any disclaimer, the term of this patent is extended or adjusted under 35 U.S.C. 154(b) by 123 days.

(21) Appl. No.: 13/346,242

(22) Filed: Jan. 9, 2012

(65) Prior Publication Data
US 2013/0176154 A1 Jul. 11, 2013

(51) Int. Cl.
*H03M 1/12* (2006.01)

(52) U.S. Cl.
USPC ........................ 341/155; 341/118; 341/120

(58) Field of Classification Search
USPC .............................. 341/118, 120, 155
See application file for complete search history.

(56) References Cited

U.S. PATENT DOCUMENTS

| | | | |
|---|---|---|---|
| 7,106,236 B2 * | 9/2006 | Asami et al. | 341/155 |
| 7,148,828 B2 | 12/2006 | Fernandez et al. | |
| 7,161,514 B2 | 1/2007 | Tamba | |
| 7,283,074 B2 | 10/2007 | Sheng et al. | |
| 7,312,734 B2 * | 12/2007 | McNeill et al. | 341/120 |
| 7,330,140 B2 | 2/2008 | Balakrishnan et al. | |
| 7,336,729 B2 * | 2/2008 | Agazzi | 375/316 |
| 7,535,390 B2 | 5/2009 | Hsu | |
| 7,808,408 B2 * | 10/2010 | Madisetti et al. | 341/118 |
| 7,839,313 B2 | 11/2010 | Kidambi | |
| 7,839,323 B2 * | 11/2010 | Kidambi | 341/118 |
| 2010/0073206 A1 | 3/2010 | Lee | |
| 2011/0001645 A1 | 1/2011 | Messier et al. | |
| 2011/0248876 A1 * | 10/2011 | Wikner | 341/159 |

OTHER PUBLICATIONS

Morin, D. et al, "An Intellectual Property Module For Auto-Calibration of Time-Interleaved Pipelined Analog-To-Digital Converters", Proceedings of the 4th IEEE International Workshop on System-on-Chip for Real-Time Applications, IWSOC Jul. 2004, pp. 1-4.
Elbornsson, J. et al., "Blind Equalization of Time Errors in a Time-Interleaved ADS System", IEEE Transactions on Signal Processing, vol. 53, No. 4, Apr. 2005, pp. 1413-1424.
Hsu, C. et al., "An 11b 800MS/s Time-interleaved ADC with Digital Background Calibration", ISSCC 2007/ Session 25/ Nyquist ADC Techniques / 25.7, Feb. 14, 2007, 3 pages.
Long, S. et al., "A Calibration Architecture for Improving the Performance of Time-Interleaved ADC", IEEE, National ASIC System Engineering Research Center, 2007, pp. 577-580.

(Continued)

*Primary Examiner* — Khai M Nguyen
(74) *Attorney, Agent, or Firm* — David Cain; Roberts Mlotkowski Safran & Cole, P.C.

(57) ABSTRACT

A time-interleaved analog-to-digital converter (ADC) includes a plurality of ADC blocks each including: at least one ADC unit configured to convert an analog input to a digital output; and a digital gain controller configured to adjust a reference voltage of the at least one ADC unit based on a comparison of an actual output of the at least one ADC unit to an expected output of the at least one ADC unit.

25 Claims, 8 Drawing Sheets

(56) References Cited

OTHER PUBLICATIONS

Beydoun, A. et al., "A Novel Digital Calibration Technique for Gain and Offset Mismatch in Parallel TIΣΔ ADCs", Telecom ParisTech, IEEE, ICASSP, 2010, pp. 4158-4161.

Xu, G. et al., "Adaptive Calibration of Gain and Offset Errors for Time-Interleaved ADCs", Microelectronics and Electronics (PrimeAsia), Sep. 22-24, 2010, 4 pages.

* cited by examiner

OFF-LINE GAIN CALIBRATION IN A TIME-INTERLEAVED ANALOG-TO-DIGITAL CONVERTER

FIELD OF THE INVENTION

The invention relates to analog to digital converters and, more particularly, to an apparatus and a method for off-line gain calibration in a time-interleaved analog-to-digital converter.

BACKGROUND

Converting information in the form of analog signals to equivalent information in digital form is historic and ubiquitous in the microelectronics industry. This is because a great deal of the information produced by the physical world is analog in nature, e.g., audio signals, video signals, magnetic and electric fields, etc. As the ability to process information in digital form increases exponentially with the sophistication and scaling of digital integrated circuits, there is an ever increasing desire to convert analog signals to digital form to take advantage of these increased digital processing capabilities.

There are several approaches to the task of converting analog signals to digital form. These include various architectures or algorithms that can be implemented using analog and digital circuit designs. These architectures include flash analog-to-digital converters (ADCs), delta-sigma ADCs, pipelined ADCs, and several others. Two notable specifications of interest in an ADC are the sampling rate and the nominal resolution. The sampling rate is the rate in samples per second (S/s) at which the analog input is converted to a digital output. The nominal resolution is the number of bits in the digital output and is related to the accuracy with which the digital output represents the analog input. For example, in a one-bit ADC, the only property of the input that can be expressed in the output is whether or not it is above or below some level; in a two bit converter the input can be expressed as being in one of four regions, etc. As the number of bits of precision is increased, the accuracy with which the digital output approximates the true analog input improves but the error never goes to zero. This so-called quantization error is an inherent impairment of analog-to-digital converters.

One approach to analog-to-digital conversion is called successive approximation. In this approach, as with all ADCs, the analog input is constrained to fall within some predetermined range called the full-scale range. In a successive approximation converter, a digital-to-analog converter (DAC) whose output is constrained to nominally the same full-scale range is present. In a first processing step, the analog signal is sampled and held for subsequent conversion steps. In a second conversion step, a comparator circuit compares the sampled analog input to the DAC output when the DAC input is set to exactly one-half of its full-scale digital range. By this method, the analog input is determined to be in either the bottom half of the full-scale range (e.g., when the comparator output reads binary zero) or in the top half of the range (e.g., when the comparator reads a binary one). The result of this decision is the most significant bit (MSB) of the ADC's digital output. In a third conversion step, the DAC input is re-set to a value halfway between its half full scale value and either the zero value or the maximum value depending on the result of the comparison in the second step. By this method, the analog input is determined to be in either the bottom half or the top half of the remaining possible range of values after the result of the comparison in the first step. In subsequent conversion steps, this process is repeated until all bits in the ADC digital output are decided.

The successive approximation converter provides analog simplicity and ease of implementation in digital-centric CMOS integrated circuit fabrication processes. Such a converter requires at least 'N' steps to complete its task, where 'N' is the number of bits in the digital output. Typically at least one additional step is added to allow for sampling and/or settling at the analog input. A number 'm' of additional steps may be added for other purposes, bringing the total number of steps to N+1+m. Each step in the conversion process is typically allotted a fixed time 'T' associated with the period of a clock available on the chip/system in which the ADC operates. As a result, the time required for each conversion is Tconv=(N+1+m)*T seconds where the converter sample rate is limited to 1/Tconv samples per second (S/s).

Another approach to analog-to-digital conversion is time interleaving. In this approach, a plurality of identical converter unit cells operate on an analog signal sampled at a multiple of the sample rate of each converter, where the multiple is equal to the number of converter unit cells in the plurality of converter unit cells. For an analog signal sampled at time interval T seconds, e.g., having a sample rate of 1/T samples/second (S/s), two converters each operating at a sample rate of ½T S/s can be used to digitize these samples at an aggregate rate of 1/T S/s. A first analog sample is sent to the first of the two converters at time zero and a second analog sample is sent to the second converter at time T. The first converter completes its task at time 2T, at which time a third analog sample is sent; the second converter completes its task at time 3T and a fourth analog sample is sent; and the process repeats. Similarly, three identical converters operating at a sample rate ⅓T can achieve the same result, and so on. Each additional cycle required by the individual converter can be accommodated at the same system sample rate by adding another converter to the plurality of converters in the time interleaved system. In this manner a plurality of N slow converters can be operated in such a way as to achieve an effective sample rate of N times the sample rate of the slow converters.

A notable characteristic of any ADC is its gain. Since the function of an ADC is to convert an analog input to digital codes at the output, the gain has the units of codes per unit of analog input, e.g. codes/volt. For example, an ADC having a gain of 1000 codes/volt increases its output digital code by 1 when the analog input value increased by 1 mV. More generally, the ADC analog input is typically taken as a ratio with respect to the full scale reference potential and the transfer function may also feature some offset, so the equation for the transfer function is given by Equation 1:

$$\text{Code\_Out} = 2^N * (V\text{in} + V\text{os})/V\text{ref} + \text{Center\_Code} \quad (1).$$

In Equation 1, Vin is the analog input to the ADC and Vref is the analog full-scale reference voltage. N is the number of bits of resolution in the ADC. Vos is any offset that may be present in the analog signal or offset introduced in the ADC itself. A quantity Center_Code, typically $2^{N-1}$, is added to avoid the need for a sign bit in the output when the analog input takes on both positive and negative values.

In a time-interleaved converter comprising a plurality of ADC units, each ADC unit ideally matches all of the others. Specifically, both the gain and the offset are the same for all ADC units in the time-interleaved block. This may not, however, be the case due to random variations in electrical parameters of the devices used to build the ADC units. For example, each unit may have a statistical offset that results from random mismatches in the components used to construct the comparator circuit, e.g., MOS (metal oxide semiconductor) or bipolar transistors primarily but also potentially various types of integrated passive components such as resistors and capacitors. Separate from (e.g., independent of) such offset, each ADC may additionally or alternatively have a gain error of some magnitude, resulting in a transfer function after offset cancellation given by Equation 2:

$$\text{Code\_Out} = Ax * 2^N * Vin / Vref + \text{Center\_Code} \qquad (2).$$

In Equation 2, the term 'Ax' is a gain error term statistically distributed around 1.00. Equivalently, errors resulting from non-idealities in Vref (e.g., noise, ohmic drops in distribution wires, etc.) between units in the ADC also can manifest as gain errors. Gain errors subsequently manifest as errors in the output of the ADC. For example, when a constant analog input is applied to two nominally identical ADC units, gain error associated with one or both of the units may cause the units to produce different digital results. These gain errors can be measured and quantified using traditional ADC characterization techniques including signal to noise ratio and signal to noise and distortion.

Additionally, offset cancellation techniques typically eliminate offset generated within a time-interleaved ADC but are incapable of eliminating offsets springing from other sources external to the ADC. Such sources can include the electronics driving the ADC and other elements upstream of the ADC.

An additional complication occurs when the time-interleaving of ADC unit cells have two levels (e.g., a two-level time-interleaved ADC). In a dual level time interleaved ADC, the ADC unit cells are themselves comprised of a plurality of sub-unit cells sampling at an even lower rate. For example, a two-level 32 GS/s ADC may comprise four 8 GS/s ADC blocks, each of which is in turn comprises sixteen 500 MS/s unit cells. The full-scale reference voltages may be generated at the level of the 8 GS/s blocks, but the underlying reference voltages from which these full-scale references are generated must be connected to all four of the 8 GS/s blocks without loss of accuracy. Typically this level of accuracy is impossible, resulting in the need for a gain calibration.

Accordingly, there exists a need in the art to overcome the deficiencies and limitations described hereinabove.

SUMMARY

In a first aspect of the invention, there is a time-interleaved analog-to-digital converter (ADC) including a plurality of ADC blocks each comprising: at least one ADC unit configured to convert an analog input to a digital output; and a digital gain controller configured to adjust a reference voltage of the at least one ADC unit based on a comparison of an actual output of the at least one ADC unit to an expected output of the at least one ADC unit.

In another aspect of the invention, there is a calibration circuit for a time-interleaved analog-to-digital converter (ADC) including a digital gain controller configured to compare an actual output of an ADC unit of the time-interleaved ADC to an expected output of the ADC unit. The calibration circuit also includes a digital-to-analog converter (DAC) structured to adjust a differential reference voltage for the ADC unit based on: (i) an initial differential reference voltage received from an interleaver circuit of the time-interleaved ADC, and (ii) at least one control signal generated by the digital gain controller based on the comparison.

In yet another aspect of the invention, there is a mixed-signal (part analog and part digital) gain optimization loop in a time-interleaved analog-to-digital converter (ADC) apparatus that includes a time-interleaved ADC having a sample rate of 1/T S/s and comprising a plurality of 'M' ADC blocks each of which further comprises 'N' ADC unit cells having a sample rate of 1/(M*N*T) Samples/second. The apparatus also includes a circuit element configured to provide a reference voltage to be used as a full-scale reference for the 'N' ADC unit cells in each of the 'M' ADC blocks, wherein the reference voltage is a differential analog reference voltage defined by a difference between two absolute voltages taken with respect to a first power supply. The apparatus also includes a reference voltage element configured to digitally adjust one or both of the absolute voltages. The apparatus also includes a digital calculation element configured to adjust a digital control of the reference voltage element. The digital calculation element is operational during application of a predefined analog input signal to an input of the time-interleaved ADC. The predefined analog input signal has two unique and predetermined levels differing from one another by a predefined nominal amount related to the initial differential reference voltage. The digital calculation element separately calculates: a first average of digital outputs of even ones of the plurality of 'N' ADC unit cells; a second average of digital outputs of the odd ones of the plurality of 'N' ADC unit cells; a first difference between the first and second averages; and a second difference between: the first difference and the predefined nominal amount.

In another aspect of the invention, there is a method of gain calibration of a time-interleaved analog-to-digital converter (ADC) apparatus. The method includes providing a reference voltage to at least one ADC unit of the time-interleaved ADC, wherein the reference voltage is initially greater than a nominal full scale reference voltage range of the at least one ADC unit. The method also includes supplying a predefined analog input signal to the at least one ADC unit. The method also includes sampling an actual output of the at least one ADC unit generated based on the reference voltage and the predefined analog input signal. The method also includes comparing the actual output to an expected output associated with the predefined analog input signal. The method also includes adjusting the reference voltage based on the comparing.

In another aspect of the invention there is a method of gain calibration of a time-interleaved analog-to-digital converter (ADC) apparatus. The method includes providing a reference voltage to at least one ADC unit of the time-interleaved ADC, wherein the reference voltage is initially greater than a nominal full scale reference voltage range of the at least one ADC unit. The method also includes supplying a predefined analog input signal to the at least one ADC unit. The method also includes determining a first average of first digital outputs of the at least one ADC unit, wherein the first digital outputs correspond to a first level of the predefined analog input signal. The method also includes determining a second average of second digital outputs of the at least one ADC unit, wherein the second digital outputs correspond to a second level of the predefined analog input signal. The method also includes determining a difference between the first and second averages. The method also includes comparing the difference to an expected value for the predefined analog input signal. The method also includes adjusting the reference voltage based on the comparing.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
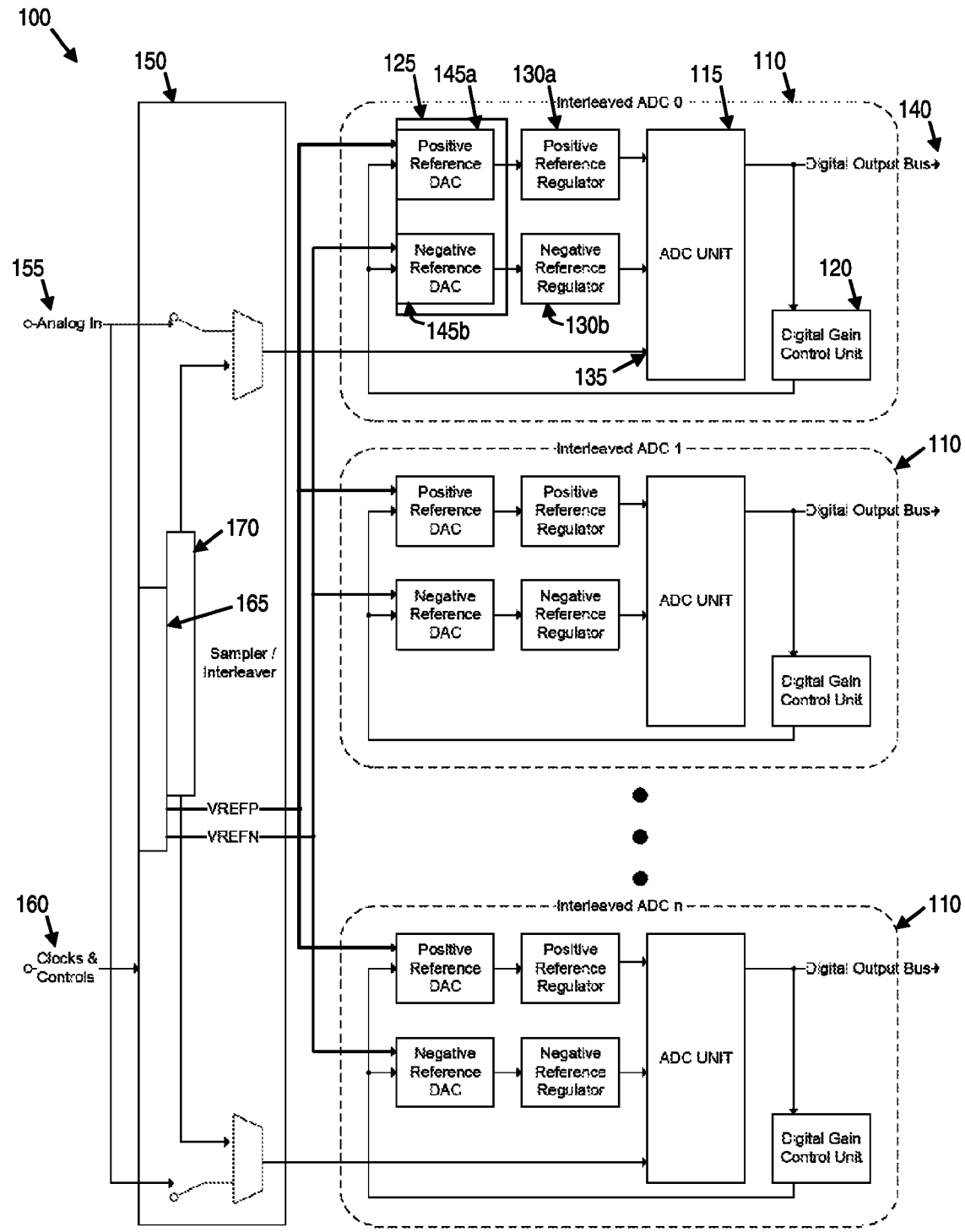
FIG. 1 is a block diagram of a time-interleaved analog-to-digital converter with a gain calibration apparatus in accordance with aspects of the invention.

The invention relates to analog to digital converters and, more particularly, to an apparatus and a method for off-line gain calibration in a time-interleaved analog-to-digital converter (ADC). In accordance with aspects of the invention, gain calibration is provided for an ADC by applying a reference voltage and a predetermined pattern of analog inputs to the ADC, comparing an actual digital output of the ADC to an expected output, and iteratively adjusting the reference voltage until the digital output is within an acceptable range of the expected output.

In embodiments, the calibration apparatus includes an adjustable digital-to-analog converter (DAC) that receives a reference voltage from the analog signal source and adjusts the full-scale reference voltage to the ADC based on signals from a digital gain controller. The calibration apparatus also includes voltage regulators coupled to an output of the adjustable DAC and full-scale reference voltage inputs of the ADC. The calibration apparatus also includes the digital gain controller, which receives the digital output from the ADC, compares the digital output to an expected output for the predetermined pattern of analog inputs, and sends control signals to the adjustable DAC to adjust the DAC based on the comparison. The DAC then provides a new adjusted full-scale reference voltage to the ADC, which produces a new digital output, which may be compared to the expected result for a successive adjustment. In this manner, a feedback loop is provided in which the digital gain controller repeatedly adjusts the DAC based on a comparison of the actual output of the ADC to an expected output of the ADC, and the adjustments continue until the actual output is within a predetermined range of the expected output.

Implementations of the invention further provide an apparatus and a method for minimizing the gain error in a time-interleaved ADC during an interval when the ADC is off-line, e.g., is out of service or being initialized. In embodiments, the calibration utilizes a difference calculation between adjacent samples from the ADC in which both operands in the difference calculation are subject to the same ADC offset, if any offset exists. Accordingly, the offset is canceled out of the calculation, such that implementations of the invention adjust the gain of the ADC in a manner that is insensitive to (e.g., decoupled from) any offset that may be present in the ADC.

In accordance with aspects of the invention, the gain calibration uses a training pattern (also referred to as a "reference waveform" or "predefined analog input") generated by the same circuitry that delivers the analog samples to the ADC unit. In this way, the ratio between the full-scale analog sample swing and the signal levels in the training pattern can be precisely controlled, for example by employing the ratio of matching components such as integrated resistors. In embodiments, the training pattern is a two-level pattern that changes at the sample rate of the interleaved ADC. For example, when the ADC is a 4 GS/s ADC, the training pattern alternates between each of two levels every 250 ps. The levels in the gain training pattern are selected to be well within the anticipated full-scale reference even after gain error is included so that the ADC will not saturate during gain calibration, i.e., the first iteration of the calibration always creates a minimum or maximum digital output code because the input is outside of the full-scale reference range. In embodiments, the difference between levels in the gain training pattern is chosen to be ¾ of the full-scale reference. For example, for a full-scale reference of 500 mV and an ADC cell sampling rate of 4 GS/s, the gain training pattern is a 375 mV peak-peak square wave with a period of 500 ps. For a 7-bit ADC this results in a code swing of 96 when the gain is properly calibrated.

Implementations of the invention may be used in an ADC system in which there is a single level of interleaving, e.g., in which digital samples from each ADC block are processed sequentially in time. In such implementations, both levels in the gain training pattern are digitized sequentially. Averages of the digital output caused by the training pattern are calculated based on the difference between consecutive digital samples from each block. Taking the difference between consecutive digital samples removes offset from consideration in the calibration since both samples in a consecutive pair see the same offset, if any offset exists in the ADC. As such, implementations of the present invention may operate as a two-tap digital finite impulse response (FIR) filter with taps (1,−1), which has no response to DC phenomena such as offset.

Implementations of the present invention may also be used in an ADC system in which there is a dual level of interleaving, e.g., in which digital samples from each ADC unit cell in a second level of interleaving are processed. In such implementations, all the unit cells share a common positive and negative reference, each of which is independently adjustable. In embodiments, the high and low averages of the digital output caused by the training pattern are calculated using samples from alternating unit cells (instead of the temporally adjacent samples from a single cell as described above with respect to a single level time interleaved ADC). Because there are two levels in the gain training pattern, all even-numbered unit cells digitize one of the two levels and all of the odd samples digitize the other. The difference between the two sets of digitized levels is averaged and is immune to system-level offsets for the reasons described above with respect to the single level time interleaved ADC.

FIG. 1 is a block diagram of a time-interleaved analog-to-digital converter (ADC) 100 with a gain calibration apparatus in accordance with aspects of the invention. The ADC 100 comprises any number "n" of ADC blocks 110 arranged in a time interleaved manner. In embodiments, each ADC block 110 comprises an ADC unit 115, a digital gain controller 120, a digital-to-analog converter (DAC) 125, and a pair of voltage regulators 130a and 130b. The ADC unit 115 may comprise any suitable ADC unit that converts an analog input voltage 135 to a digital output voltage 140. The DAC 125 may comprise a positive reference DAC 145a and a negative reference DAC 145b, as depicted in FIG. 1. The operational details (e.g., functionality) of the DAC 125, regulators 130a and 130b, and digital gain controller 120 are described in greater detail herein with respect to FIG. 4.

According to aspects of the invention, the ADC 100 includes an interleaver circuit 150 that samples a main analog input 155 (e.g., the analog voltage to be converted to a digital output) at a predetermined rate based in part on a clock signal 160 and other controls. In embodiments, the interleaver circuit 150 comprises an internal reference generator 165 that generates reference voltages VREFP and VREFN that are provided to the DAC 125 of each ADC block 110. More specifically, and as shown in FIG. 1, VREFP and VREFN are respectively provided to the positive and negative reference DACS 145a and 145b of each of the ADC blocks 110.

In embodiments, the interleaver circuit 150 also includes an internal pattern generator 170 that generates a reference waveform that is provided as the analog input 135 of the ADC unit 115 of each ADC block 110 during gain calibration. In particular, the interleaver circuit 150 is configured to generate the reference waveform of a predetermined desired fraction of the full-scale analog input of the ADC 100. In embodiments, this is accomplished by referencing both the analog full-scale input signal level and the reference waveform to a common reference system, although other techniques may be used within the scope of the invention. The interleaver circuit 150, including the reference generator 165 and the pattern generator 170, may comprise any suitable arrangement of software, hardware, or a combination of software and hardware that is configured to provide the functionality described herein.

In accordance with a particular exemplary embodiment, the ADC 100 comprises sixteen time-interleaved ADC blocks 110 (e.g., numbered 0 through 15) which each operate at 4 GS/s (Giga-samples per second). The interleaver circuit 150 samples the main analog input 155 at a rate of 64 GS/s (e.g., every 15.625 ps) and holds each sample for a period of time equal to the number of time-interleaved ADC blocks 110 (e.g., sixteen in this example) times the 15.625 ps sample interval for a total of 250 ps (e.g., 16 times 15.625 ps). As such, the sampling rate of the overall ADC is 64 GS/s.

Figure 2:
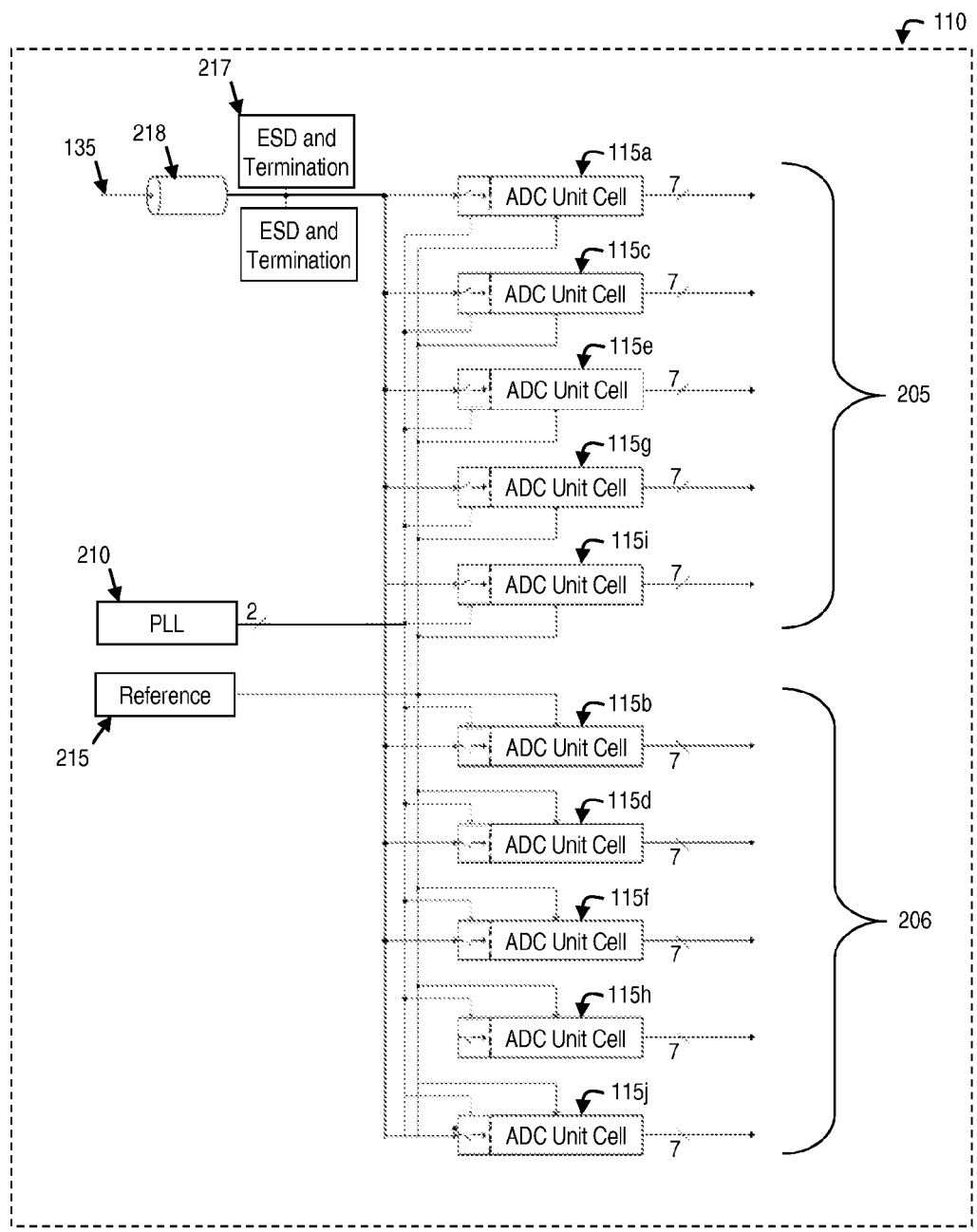
FIG. 2 is a block diagram of a second level of a time-interleaved analog-to-digital converter in accordance with aspects of the invention.

The time interleaved ADC 100 depicted in FIG. 1 may be implemented as a single level time interleaved ADC in accordance with aspects of the invention. Optionally, although not necessary for the practice of the present invention, additional sub-levels of time interleaving may be used with the time interleaved ADC 100. For example, as shown in FIG. 2, each one of the sixteen ADC blocks 110 (e.g., each one of the 4 GS/s blocks) may comprise ten ADC unit cells 115a-j each operating at 400 MS/s, instead of a single ADC unit 115. In this manner, the ADC 100 comprises a first level of sixteen ADC blocks 110 each comprising a second level of ten ADC unit cells 115a-j, such that the ADC includes 16*10=160 ADC unit cells each operating at 400 MS/s.

According to aspects of the invention, the sampled analog values of the analog input 135 are converted to seven digital bits by the ten active unit cells 115a-j in sequence. For example, the first sample goes to the first unit cell 115a at time 0 and is converted by time 2.5 ns, the second sample goes to the second unit cell 115b at time 250 ps and is converted by time 2.75 ns, and so on for all ten unit cells 115a-j, thereby achieving a net rate of ten 7-bit conversions of ten 250 ps samples in 2.5 ns. Group 205 comprises cells 115a, c, e, g, and i designated as even unit cells, and group 206 comprises cells 115b, d, f, h, and j designated as odd unit cells, which are described in greater detail herein with respect to FIG. 5A. Block 210 represents a phase lock loop (PLL) that generates clocks for the ADC unit cells 115a-j. Block 215 represents the calibration signal applied to the ADC unit cells 115a-j from voltage regulators 130a and 130b. The ADC unit 110 may also be provided with electrostatic discharge (ESD) protection circuitry and termination network 217, as well as a controlled impedance transmission line 218 for provision of the analog input signal, or any combination of these.

Figure 3:
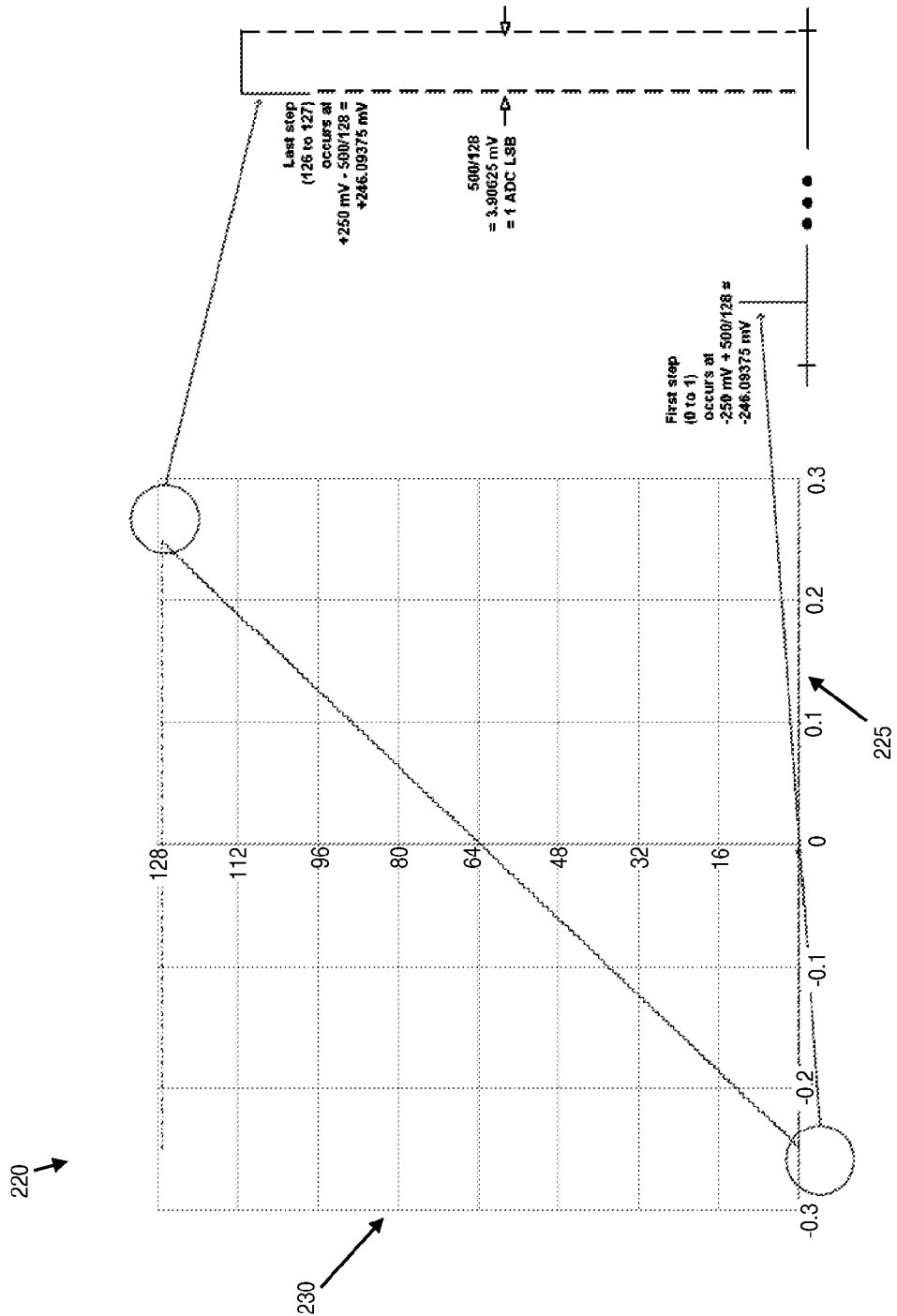
FIG. 3 is a transfer function of a time-interleaved analog-to-digital converter in accordance with aspects of the invention.

FIG. 3 shows a transfer function 220 of the ADC 100 in accordance with aspects of the invention. All analog to digital converters receive an analog reference input voltage (e.g., Vref) which identifies the analog voltage that corresponds to the full scale output code. For a converter with a differential analog input (e.g., Vin), with output code equal to one half of full-scale code when the input voltage is zero (such as the 7-bit conversion shown in FIG. 3), the reference input (e.g., Vref) determines the gain of the converter according to Equation 3:

$$\text{Code\_Out} = INT(((2^N * V\text{in})/V\text{ref}) + 2^{N-1}) \qquad (3).$$

In FIG. 3, the horizontal axis 225 represents differential input voltage (e.g., Vin) and the vertical axis 230 represents digital output (e.g., Code_Out). The analog input of the ADC 100 may be a differential input that can take on both positive and negative values, although a differential input is not necessary for practicing the invention. In embodiments, the full-scale range of the input signal is nominally −250 mV-to +250 mV. In this manner, for the 7-bit ADC 100, an input voltage of −250 mV produces an output code of 000 0000 (e.g., 0) and an input of +250 mV produces an output code of 111 1111 (e.g., 127). Hence, the nominal gain of the ADC 100 is 128 codes per 500 mV (e.g., 256 codes per Volt). In the transfer function 220 shown in FIG. 3, the Y-intercept is nominally at 64, which means that zero differential input is converted to code 64. However, any desired code conversion to a signed number system, e.g., such as two's complement, may be applied in post-processing the digital output. For example, the output may be post processed such that an output of 1000000 indicates a result of −64 and an output of 0111111 indicates a result of +63. Both numbering systems described herein, and others, can be used within the scope of the invention.

As shown in FIG. 3, the least significant bit (LSB) of the transfer function corresponds to 500/128=3.9 mV. As such, the first step of the transfer function (e.g., from output code 0 to 1) occurs at about −246 mV, and the last step of the transfer function (e.g., from output code 126 to 127) occurs at about +246 mV.

FIGS. 1-3 have thus far been described with respect to a 7-bit time interleaved ADC 100 having a number of ADC units operating at sampling rates, and with a full scale range and gain. However, these operational parameters, e.g., number of bit conversions, number of ADC units, sampling rate, full scale range, gain, etc., are exemplary and are not intended to limit the present invention. Instead, embodiments of the invention may be implemented with any suitable operational parameters.

Figure 4:
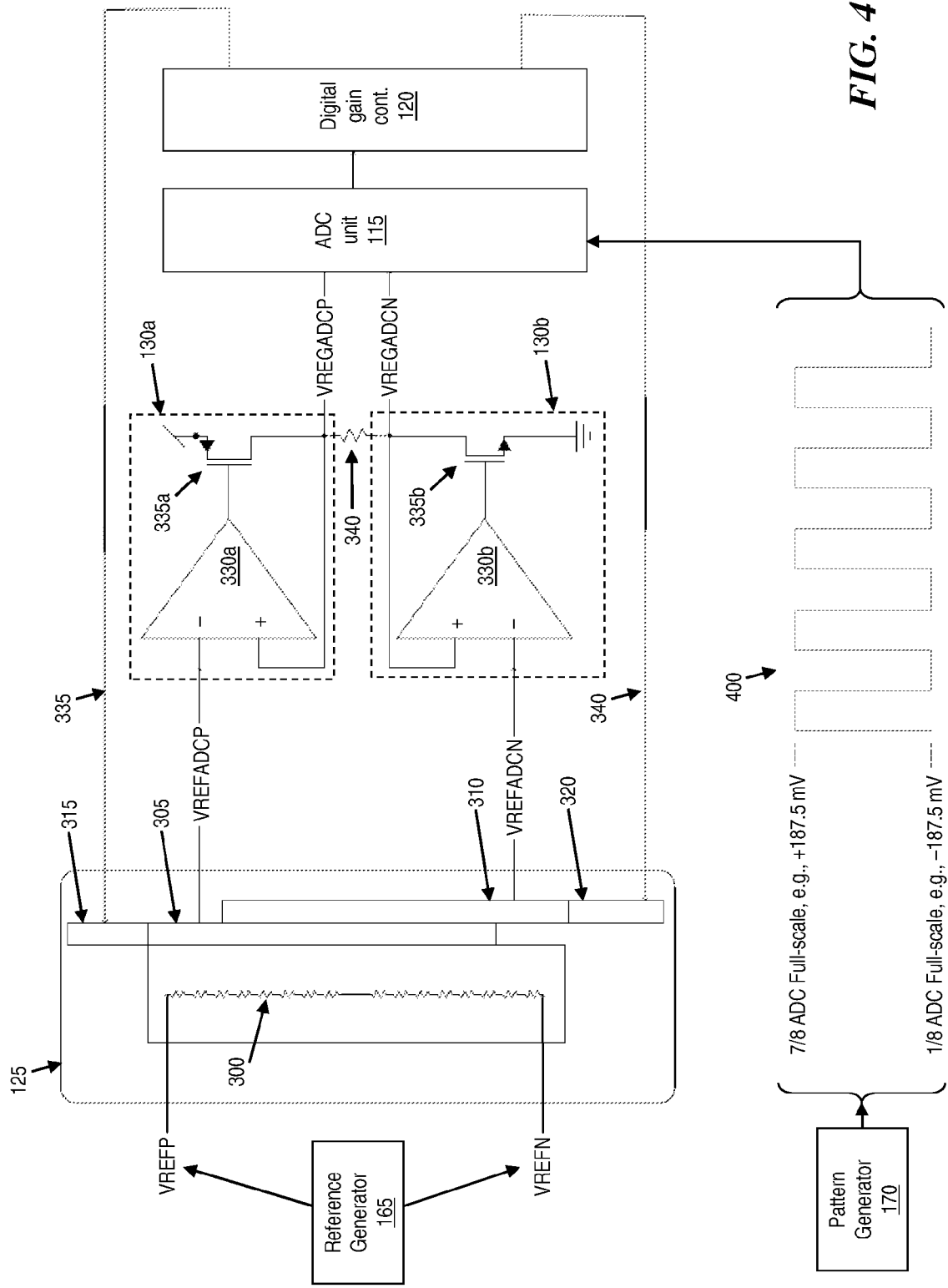
FIG. 4 is a block diagram of a gain calibration apparatus in accordance with aspects of the invention.

FIG. 4 depicts details of the ADC unit 115, digital gain controller 120, DAC 125, and voltage regulators 130a and 130b in accordance with aspects of the invention. In embodiments, the DAC 125 receives VREFP and VREFN (e.g., the differential analog reference voltage) from the reference generator 165 as two reference potentials at ends of a resistor string 300, which is a resistive divider. The DAC 125 includes a high reference selection switch 305 and a low reference selection switch 310 that each tap the resistor string 300 at respective desired locations between the two reference potentials (e.g., between nodes corresponding to VREFP and VREFN). In this manner, the DAC 125 generates two adjusted reference voltages VREFADCP and VREFADCN based on VREFP and VREFN as modified by the tap locations along the resistor string 300. For example, VREFADCP is based on VREFP modified by a portion of the resistor string 300 defined by the tap location of the high reference switch 305.

In accordance with aspects of the invention, the respective locations along the resistor string 300 at which the selection switches 305 and 310 tap into the resistor string 300 are based on signals 335, 340 received from the digital gain controller 120 and decoded by high reference decode circuitry 315 and low reference decode circuitry 320 respectively. The respective locations at which the selection switches 305 and 310 tap into the resistor string 300 are controlled independently of one another, e.g., the high reference selection switch 305 can change a tap location along the resistor string 300 independent of the low reference selection switch 310, and vice versa. In embodiments, the resistor string DAC 125 includes six control bits, 64 output levels between 200 mV and 300 mV differential, and a net impedance of about 100 kOhms to about 115 kOhms; although the invention is not limited to this example, and other suitable configurations for providing an adjustment to VREFP and VREFN in the manner described herein may be used within the scope of the invention.

According to aspects of the invention, the DAC 125 drives the voltage regulators 130a and 130b by providing the adjusted reference voltages VREFADCP and VREFADCN to the regulators. In embodiments, the voltage regulators 130a and 130b are low-dropout linear voltage regulator circuits that directly provide the full scale reference to the ADC unit cell (e.g., ADC unit 115 or ADC unit cells 115a-j). The voltage regulators 130a and 130b are provided due to the substantial charge that the ADC unit cells may draw from the full-scale reference and the high impedance of the resistor DAC 125. In embodiments, the voltage regulators 130a and 130b provide adjusted and regulated reference voltages VREGADCP and VREGADCN to the ADC unit 115. In this manner, the combination of the DAC 125 and voltage regulators 130a and 130b permits the full scale voltage of the ADC unit cells to be adjusted. Due to bandwidth limitations and in the regulators and the high impedance of the resistor DAC 125, the system may require a settling interval (e.g., a number of cycles) to complete an adjustment.

The voltage regulators 130a and 130b may comprise, for example, respective amplifiers 330a, 330b, pass transistors 335a, 335b, and a resistor 340 arranged as shown in FIG. 4; although other configurations may be used within the scope of the invention. The resistor 340 may have a selectable resistance value, such as 9, 12, 18, or 33 Ohms; although other values may be used within the scope of the invention.

Gain calibration of the ADC (e.g., ADC 100) in accordance with aspects of the invention is described herein with reference to FIGS. 1-4. In embodiments, the gain calibration is performed offline, e.g., when the ADC 100 is out of service and/or being initialized. The reference generator 165 sets the difference between VREFP and VREFN to values outside of (e.g., greater than) the nominal full scale reference voltage range of the ADC 100. In the example of an ADC 100 having a full scale range of +250 mV to −250 mV, the reference generator 165 sets the difference between VREFP and VREFN to +300 mV, which is 20% greater than the positive or negative limits of the full scale range, although any settings that are increased relative to the limits of the full scale range may be used within the scope of the invention.

Also, during calibration, the pattern generator 170 generates a reference waveform 400, shown in FIG. 4, having a known period and amplitude with respect to the analog full-scale level, and applies this training pattern to the analog input of the ADC units. In embodiments, the reference waveform 400 is a square wave having high and low values that are within (e.g., less than) the analog full-scale level. For example, the reference waveform 400 may comprise a square wave as shown in FIG. 4, which has a range (e.g., −187.5 mV to +187.5 mV) that is 75% of the analog full-scale level (e.g., −250 mV to +250 mV). The invention is not limited to square wave, and any suitable reference waveform 400 may be used within the scope of the invention. The time required for the square wave to transition between its two levels is presumed negligible with respect to the period of the square wave. Further sampling of the square wave is presumed to occur at an instant when its value is stable; i.e. any transient settling effects have passed. This can be guaranteed by design or by additional sampling phase calibration.

During calibration, VREFP and VREFN are applied to the DAC 125. The DAC 125 and regulators 130a and 130b operate to supply VREGADCP and VREGADCN to the ADC unit 115 as the reference voltage in the manner described with respect to FIG. 4. Digital gain controller 120 initializes control signals 335 and 340 to their starting values so as to cause switches 305 and 310 to tap resistor string 300 at its ends. In this manner VREFADCP and subsequently VREGADCP are set to starting value VREFP and similarly VREFADCN and VREGADCN are set to starting value VREFN. The reference waveform 400 is applied to the ADC unit as the analog input. Based on VREGADCP and VREGADCN and the reference waveform 400, the ADC unit 115 generates a digital output, e.g., converts the analog input to a digital output e.g., according to the transfer function shown in FIG. 3 and equation (3) with Vref=(VREGADCP−VREGADCN). The digital gain controller 120 compares the digital output of the ADC unit 115 to an expected output for the reference waveform 400.

When the digital output differs from the expected output by a predefined amount, the digital gain controller 120 sends a signal 335 and 340 to the DAC 125 to change one or both of the selection switches 305 and 310. The change of the DAC 125 results in a change of one or both of VREFADCP and VREFADCN, which results in a change of the VREGADCP and VREGADCN that are applied to the ADC unit 115 as the differential reference voltage. In this manner, a successive reference voltage applied to the ADC unit 115 is adjusted based a comparison of the digital output generated by the previous reference voltage, such that a feedback adjustment is provided.

In embodiments, the reference waveform is provided as the analog input to the ADC unit 115 throughout the calibration, and VREFP and VREFN are unchanged at the input of the DAC 125. During successive cycles of the calibration, the digital gain controller 120 continues to compare the digital output to the expected output and adjust the DAC 125 based on the comparison, until the digital output is less than a predetermined difference from the expected value (e.g., until the digital output is within an acceptable predetermined range of the expected value). At this point, the settings of switches 305 and 310 in the DAC 125 are saved and used with VREFP and VREFN to supply the calibrated differential reference voltage (e.g., the last values of VREGADCP and VREGADCN) to the ADC unit 115 during normal operation.

For example, after calibration and during normal operation, the reference generator 165 maintains the values of VREFP and VREFN that were used during the calibration (e.g., 20% greater than the nominal full scale Vref) and provides these values to the DAC 125. Based on VREFP and VREFN and the final settings of the switches 305 and 310 that were obtained during the calibration, the calibrated differential reference voltage (e.g., the difference between VREGADCP and VREGADCN) is generated and applied to the ADC unit 115 during normal operation. In this manner, when an analog input is provided to the ADC unit 115 during normal operation, the calibrated differential reference voltage causes the digital output of the ADC unit 115 to be calibrated to account for the gain of the ADC unit 115.

As described herein, in embodiments, the reference generator 165 sets the values of VREFP and VREFN to be substantially larger than the nominal full-scale reference voltage for the ADC (e.g., 20% larger than nominal full scale Vref). Also in embodiments, the pattern generator 170 generates the reference waveform 400 to be substantially smaller than the full scale analog range of the ADC (e.g., having an amplitude that is about 75% of the full scale analog range). Also in embodiments, digital gain controller 120 is initialized to set control signals 335, 340 such that resistor string 300 is tapped at its ends and VREFADCP and VREFADCN are set to VREFP and VREFN respectively. In this manner, it is ensured that the changes to VREGADCP and VREGADCN are only in one direction, e.g., VREGADCP and VREGADCN are only incremented, or alternatively are only decremented, during a particular calibration. Further it is ensured that the full-scale reference to all ADCs in the interleave is at its largest possible value, subsequently the gain of each ADC in the interleave is at is smallest possible value, and the output codes from the ADCs resulting from the digitization of the reference waveform are always other than the minimum or maximum possible codes from the ADCs.

Figure 5A:
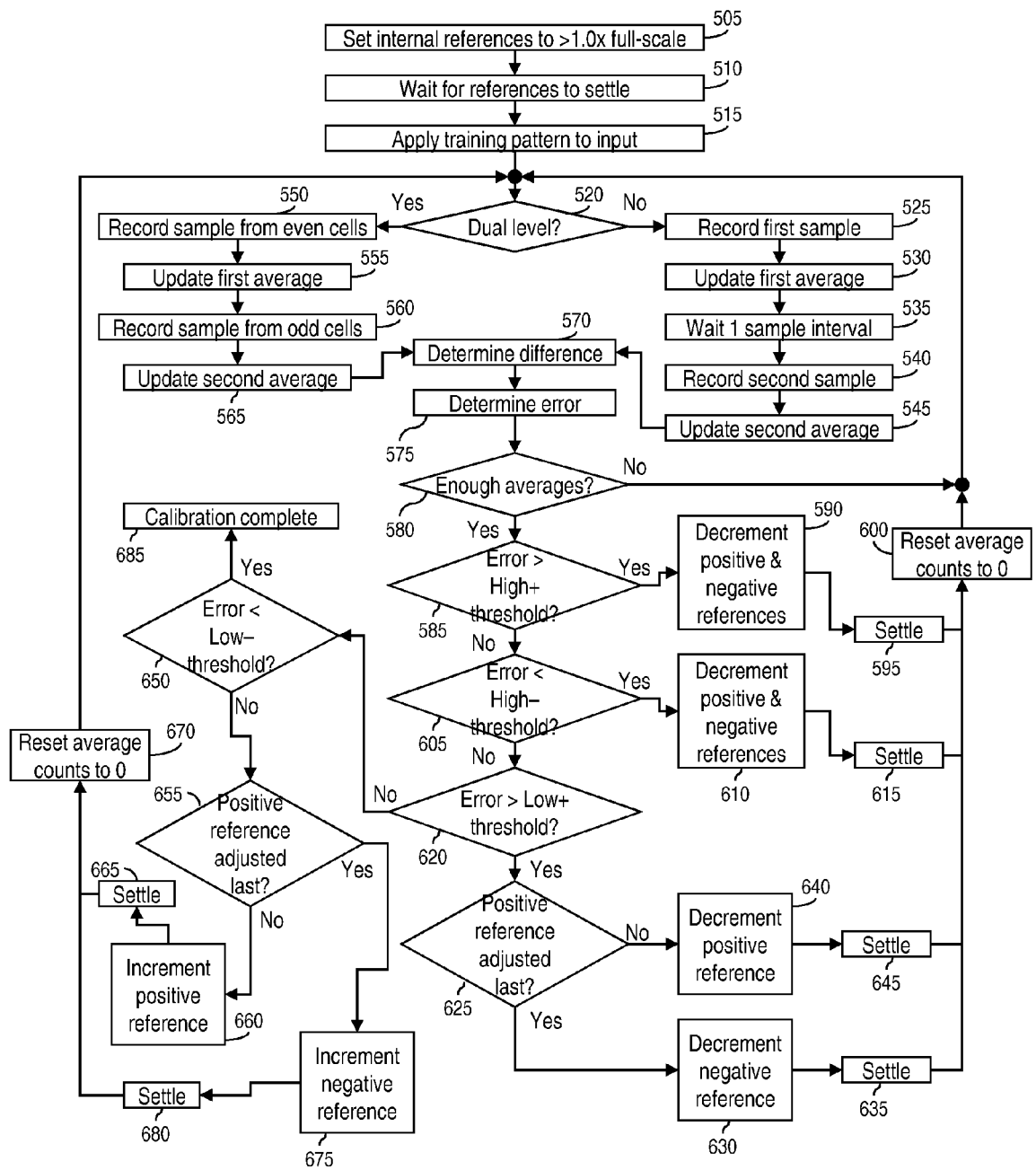
FIGS. 5A and 5B are flow diagrams of processes of gain calibration in accordance with aspects of the invention.
Figure 5B:
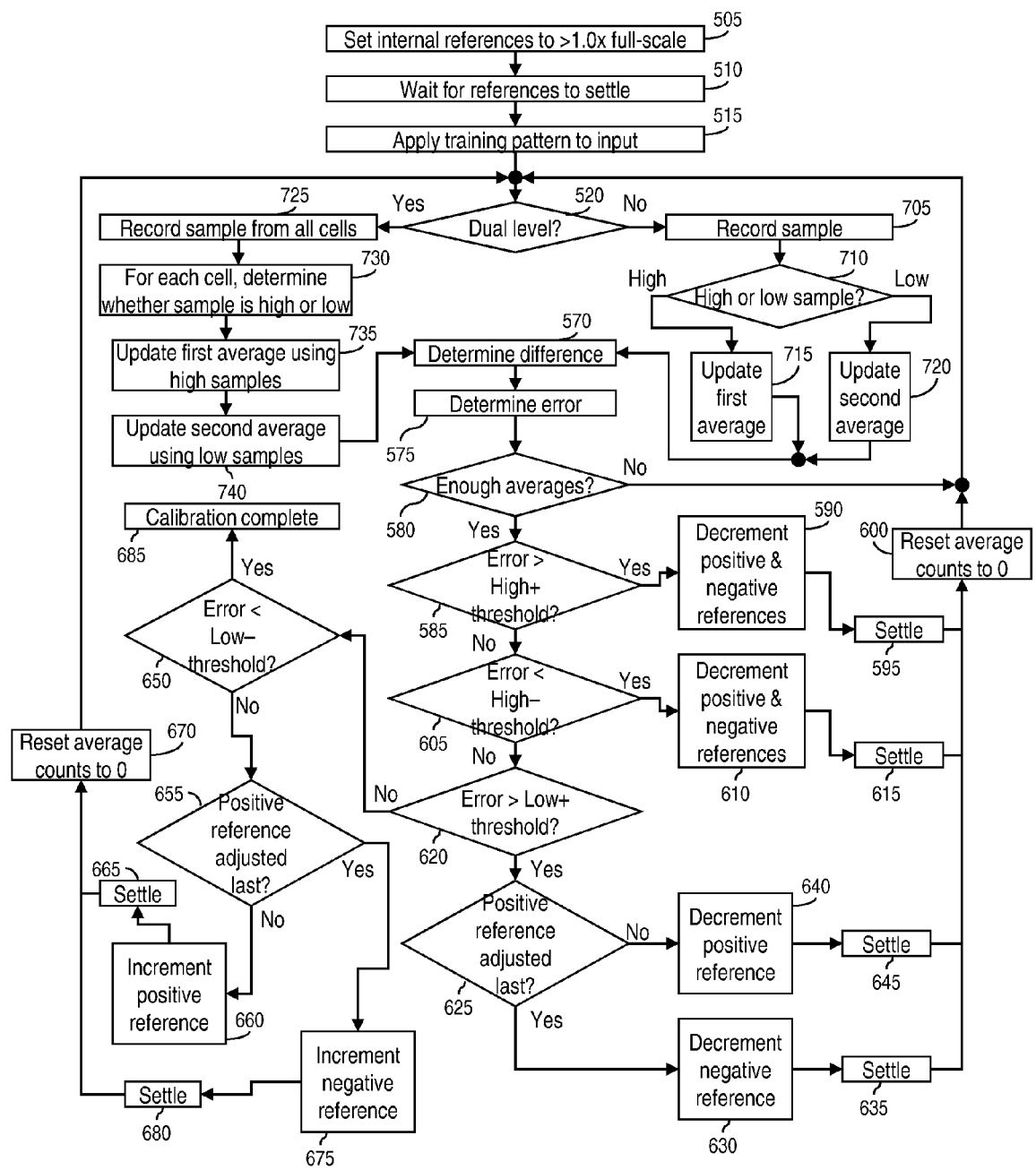

FIGS. 5A and 5B show exemplary flow diagrams for performing aspects of the present invention. The steps of FIGS. 5A and 5B may be implemented in the environments of FIGS. 1, 2, and 4 and using the techniques described therein.

The flowcharts and block diagrams shown and described herein illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Furthermore, the invention can take the form of a computer program product accessible from a computer-usable or computer-readable medium providing program code for use by or in connection with a computer or any instruction execution system. The software and/or computer program product can be implemented in the environment of FIGS. 1, 2, and 4. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disc-read/write (CD-R/W) and DVD.

FIG. 5A is a flow diagram of an iterative gain calibration process in accordance with aspects of the invention. In embodiments, the steps of FIG. 5A are performed by the interleaver circuit (e.g., interleaver circuit 150), the digital gain control (e.g., digital gain controller 120), and/or the adjustable DAC (e.g., DAC 125) described with respect to FIGS. 1, 2, and 4. At step 505, the interleaver circuit (e.g., using the reference generator 165) sets the initial reference voltages (e.g., VREFP and VREFN) to values that are greater than 1.0 times the nominal full scale reference voltage for the ADC. In embodiments, the initial reference voltages VREFP and VREFN are set to about 1.2 times (e.g., 20% greater than) the nominal full scale reference voltage, as already described herein. Digital gain controller 120 sets control signals 335, 340 to their starting values so that the resistor string 200 is tapped at its ends, thereby setting VREFADCP and VREFADCN to VREFP and VREFN respectively.

At step 510, the system waits a predetermined number of clock cycles for the ADC full-scale reference voltages (e.g., VREGADCP and VREGADCN) to settle. Any suitable number of cycles may be used for settling, and the number of cycles may be adjustable through suitable logic, as should be understood by those of ordinary skill in the art. At step 515, the interleaver circuit (e.g., using the pattern generator 170) applies the reference waveform (e.g., reference waveform 400) to the analog input of the ADC.

At step 520, the system determines whether the ADC is a single level or two level time interleaved ADC. In embodiments, the information for making this determination, e.g., data defining the type of ADC, is stored in the interleaver circuit and/or the digital gain controller. Accordingly, the determination at step 520 may comprise analyzing such stored data.

In the event the ADC is a single level time interleaved ADC, the process proceeds to step 525, at which step the digital gain controller records a first sample from the ADC. In embodiments, the first sample is a digital code that is output from the ADC (e.g., ADC unit 115) which may correspond to the high state of the reference waveform (e.g., square wave 400), and when VREGADCP and VREGADCN are supplied to the ADC as the reference voltage. At step 530, the digital gain controller updates a first average based on the sample obtained at step 525. At step 535, the digital gain controller waits one sample interval. At step 540, the digital gain controller records a second sample from the ADC. In embodiments, the second sample is a digital code that is output from the ADC (e.g., ADC unit 115) which may correspond to the low state of the reference waveform (e.g., square wave 400) but in any case is the opposite state to that digitized in the previous step, and when VREGADCP and VREGADCN are supplied to the ADC as the reference voltage. At step 545, the digital gain controller updates a second average based on the sample obtained at step 540.

In embodiments, the first and second averages calculated at steps 530 and 545 are running averages of a plurality of samples taken from the ADC at steps 525 and 540 over a number of cycles. For example, as described below with respect to step 580, the steps 525, 530, 535, 540 and 545 may be repeated a plurality of times to sample and average plural outputs of the ADC corresponding to the high and low states of the reference waveform. For example, the digital controller may sample the ADC digital output corresponding to the high state of the reference waveform X times, sum the X high output codes, and divide the sum by X to obtain the first average output code. Similarly, the digital controller may sample the ADC digital output corresponding to the low state of the reference waveform X times, sum the X low output codes, and divide the sum by X to obtain the second average output code. Moreover, although step 525 is described with respect to a high output and step 540 is described with respect to a low output, these steps could be reversed such that step 525 samples the low output and step 540 samples the high output.

In the event the ADC is determined to be a dual level time interleaved ADC at step 520, the process proceeds to step 550 at which the digital gain controller samples the digital output of the even unit cells (e.g., group 205 of unit cells 115a, c, e, g, i) corresponding to the high state of the reference waveform. At step 555, the digital gain controller computes a first average based on the samples obtained at step 550. At step 560, the digital gain controller samples the digital output of the odd unit cells (e.g., group 206 of unit cells 115b, d, f, h, j) corresponding to the low state of the reference waveform. At step 565, the digital gain controller computes a second average based on the samples obtained at step 560.

At step 570, the digital gain controller calculates a difference between the first and second averages, e.g., the first and second averages from steps 530 and 545 when the ADC is a single level time interleaved ADC, or the first and second averages from steps 555 and 565 when the ADC is a dual level time interleaved ADC. This calculated difference between the first and second averages corresponds to an actual output of the ADC unit.

At step 575, the digital gain controller determines an error between the actual output (e.g., from step 570) and an expected output of the ADC unit. The expected output of the ADC unit is based on the magnitude of the reference waveform and the transfer function of the ADC unit. In the example described with respect to FIGS. 1-4, the ADC unit is a 7-bit converter with a full scale range of 500 mV (e.g., −250 mV to +250 mV). As shown in the transfer function in FIG. 3, there are 128 different digital output codes for the ADC unit, such that the difference between the digital outputs of the high and low states of the full scale range is 127. The reference waveform 400 shown in FIG. 4 is defined by a square wave having a high state at seven-eighths of the full scale value (e.g., at +187.5 mV) and a low state at one-eighth the full scale value (e.g., at −187.5 mV). Therefore, the reference waveform is about 75% of the nominal full scale range of the ADC unit, and it follows that the difference between the high and low digital outputs for the reference waveform is expected to be 96 (e.g., 75% times 128). Accordingly, for the exemplary ADC described herein, the expected (e.g., target) value at step 575 is 96.

At step 580, the digital gain controller determines whether a sufficient number of samples have been obtained (e.g., at steps 525 and 540, or at steps 550 and 560). As described above, obtaining the samples (e.g., at steps 525 and 540, or at steps 550 and 560) and computing the first and second averages (e.g., at steps 530 and 545, or at steps 555 and 565) may be repeated X number of times to ensure accurate values for the first and second averages. At step 580, the digital gain controller determines whether X samples have been obtained. The number X can be any desired number of samples, such as, but not limited to, hundreds or even thousands of samples. In embodiments the number X may be adjustable. When X samples have not yet been obtained, then the process loops back to step 520 to obtain more samples and update the first and second averages.

On the other hand, when X samples have been obtained, then at step 585 the digital gain controller compares the error (e.g., determined at step 575) to a high positive threshold. In embodiments, the digital gain controller is programmed with (or has access to stored data defining) four threshold values for comparing to the error determined at step 575. As described in greater detail below with respect to FIG. 6, the four threshold values include: a high positive threshold, a low positive threshold, a high negative threshold, and a low negative threshold. In embodiments, the error determined at step 575 and the four threshold value are all signed values, meaning that each can be either a positive or a negative number.

When the error is greater than the high positive threshold at step 585, then at step 590 the digital gain controller generates a control signal that causes the adjustable DAC (e.g., DAC 125 shown in FIG. 4) to decrement (e.g., decrease by a predefined amount) both the positive and negative reference voltages (e.g., VREFADCP and VREFADCN). For example, at step 590, the digital gain controller sends decrement signals to both decoders of the adjustable DAC (e.g., decoders 315 and 320). Based on the decrement signals, the decoders cause the switches (e.g., switches 305 and 310) to change the respective tap locations along the resistor string (e.g., resistor string 300) in order to decrease VREFADCP and VREFADCN by a predefined amount.

In embodiments, the predefined amount is about one quarter of the voltage that changes the digital output of the ADC unit from one output code to the next output code. In the exemplary ADC 100 described in FIGS. 1-4, the full scale analog range is 500 mV, e.g., −250 mV to +250 mV, and the output code range 128, e.g., 0 to 127. The sensitivity thus can be described as about 3.9 mV per output code (e.g., 500 mV divided by 128 codes), such that a change of the analog input voltage by about 3.9 mV causes the digital output of the ADC unit to change by one unit of output code. This voltage is called the least significant bit or LSB voltage. In embodiments, the predefined amount for changing either one of VREFADCP and VREFADCN is one quarter of the nominal sensitivity which, in this example, is about 0.98 mV or one-quarter of an LSB voltage. However, the invention is not limited to this amount, and any suitable predefined amount can be used when decrementing and/or incrementing VREFADCP and VREFADCN in implementations of the invention. In embodiments, the digital gain controller, the decoders, and/or the switches are provided with logic (e.g., programming and/or hardware) that defines the predefined amount that is used at step 590.

At step 595, the digital gain controller waits for the reference voltages to settle. After changing the values of VREFADCP and VREFADCN at step 590, it takes a number of cycles for VREGADCP and VREGADCN to settle into steady state values. As such, in embodiments, the digital gain controller waits a predetermined number of cycles (e.g., clock cycles) before resetting the first and second averages to zero at step 600 and subsequently restarting the process at step 520. Any number of cycles may be employed at step 590, and the number may be adjustable.

When the error is not greater than the high positive threshold at step 585, then at step 605 the digital gain controller determines whether the error is less than the high negative threshold. When the error is less than the high negative threshold, then at step 610 the digital gain controller generates a control signal that causes the adjustable DAC (e.g., DAC 125 shown in FIG. 4) to increment (e.g., increase by a predefined amount) both the positive and negative reference voltages (e.g., VREFADCP and VREFADCN). Step 610 may be performed in a manner similar to step 590, with the difference being that at step 610 the digital gain controller generates a signal 335, 340 to increment both reference voltages by the predefined amount (rather than decrement both reference voltages by the predefined amount, as in step 590). The predefined amount at step 610 may be the same as the predefined amount described above with respect to step 590. Alternatively, the calibration circuitry may be provided with logic defining different predefined amounts for steps 590 and 610.

At step 615, the digital gain controller waits for the reference voltages to settle in the same manner as described with respect to step 595. After waiting for the reference voltages to settle, the process proceeds to step 600 where the first and second averages are reset (e.g., set to zero), and the calibration begins a new iteration at step 520.

When the error is not less than the high negative threshold at step 605, then at step 620 the digital gain controller determines whether the error is greater than the low positive threshold. When the error is greater than the low positive threshold at step 620, then at step 625 the digital gain controller determines whether the positive reference voltage (e.g., VREFADCP) was adjusted in the most recent calibration iteration. In embodiments, the digital gain controller is provided with logic, such as a latch, register or other memory, which stores a value (e.g., flag, bit, word, etc.) that defines whether the positive reference voltage (e.g., VREFADCP) was adjusted in the most recent calibration iteration, and the determination at step 625 is performed by the digital gain controller checking this value.

When the positive reference voltage (e.g., VREFADCP) was adjusted in the most recent calibration iteration, then at step 630 the negative reference voltage (e.g., VREFADCN) is decremented. In embodiments, the digital gain controller sends a control signal 340 to the DAC to decrement the negative reference voltage (e.g., VREFADCN) by the predefined amount while maintaining the current value of the positive reference voltage (e.g., VREFADCP). Step 630 may be performed in a manner similar to step 590, with a difference being that the control signal 340 at step 630 causes the DAC to decrement only the negative reference voltage but not the positive reference voltage. At step 635, the digital gain controller waits for the reference voltages to settle (e.g., similar to step 595), after which the first and second averages are reset at step 600 and the process begins a next iteration at step 520.

On the other hand, when it is determined at step 625 that the positive reference voltage (e.g., VREFADCP) was not adjusted in the most recent calibration iteration, then at step 640 the positive reference voltage (e.g., VREFADCP) is decremented. Step 640 may be performed in a manner similar to step 630, with the difference being that at step 640 only the positive reference voltage is decremented by the predefined amount, as opposed to step 630 in which only the negative reference voltage is decremented by the predefined amount. Following step 640, the digital gain controller waits for the reference voltages to settle at step 645 (e.g., similar to step 595), after which the first and second averages are reset at step 600 and the process begins a next iteration at step 520.

When it is determined at step 620 that the error is not greater than the low positive threshold, then at step 650 the digital gain controller determines whether the error is less than the low negative threshold. When the error is less than the low negative threshold at step 650, then at step 655 the digital gain controller determines whether the positive reference voltage (e.g., VREFADCP) was adjusted in the previous calibration iteration. Step 655 may be performed in the same manner as step 625.

When it is determined at step 655 that the positive reference voltage (e.g., VREFADCP) was not adjusted in the most recent calibration iteration, then at step 660 the positive reference voltage (e.g., VREFADCP) is incremented by the predefined amount. Step 660 may be performed in a manner similar to steps 630 and 640, e.g., the digital gain controller sending an appropriate control signal 335 to the adjustable DAC, with the difference being that at step 660 only the positive reference voltage is incremented by the predefined amount. Following step 660, the digital gain controller waits for the reference voltages to settle at step 665 (e.g., similar to step 595), after which the first and second averages are reset at step 670 (e.g., similar to step 600) and the process begins a next iteration at step 520.

On the other hand, when it is determined at step 655 that the positive reference voltage (e.g., VREFADCP) was adjusted in the most recent calibration iteration, then at step 675 the negative reference voltage (e.g., VREFADCN) is incremented by the predefined amount. Step 675 may be performed in a manner similar to steps 630, 640, and 660, e.g., the digital gain controller sending an appropriate control signal 340 to the adjustable DAC, with the difference being that at step 675 only the negative reference voltage is incremented by the predefined amount. Following step 675, the digital gain controller waits for the reference voltages to settle at step 680 (e.g., similar to step 595), after which the first and second averages are reset at step 670 (e.g., similar to step 600) and the process begins a next iteration at step 520.

When it is determined at step 650 that the error is not less than the low negative threshold, then at step 685 the calibration is deemed complete. At this point, the calibrated positions of the switches (e.g., switches 305 and 310 in the DAC 125 in FIG. 4) are saved such that VREFADCP, VREFADCN, VREGADCP, VREGADCN are locked at their respective calibrated values for a given input of VREFP and VREFN. Subsequently, during normal operation of the ADC unit 115, the calibrated values of VREGADCP and VREGADCN are provided to the ADC unit 115 by applying VREFP and VREFN as the differential analog reference voltage to the DAC 125 configured with the calibrated positions of the switches 305 and 310. In this manner, the ADC unit is calibrated for gain.

FIG. 5B is a flow diagram of another iterative gain calibration process in accordance with aspects of the invention. FIG. 5B depicts a process in which the training pattern comprises a pseudo random binary signal (PRBS) with pseudo randomly generated high and low levels (e.g., ones and zeros), as opposed to the periodic training pattern (e.g., square wave) described with respect to FIG. 5A. In embodiments, the steps of FIG. 5B are performed by the interleaver circuit (e.g., interleaver circuit 150), the digital gain control (e.g., digital gain controller 120), and/or the adjustable DAC (e.g., DAC 125) described with respect to FIGS. 1, 2, and 4. Steps in FIG. 5B having the same reference number as steps in FIG. 5A may be performed in the same manner as described with respect to FIG. 5A and, for brevity, are not repeated in the description of FIG. 5B.

Referring to FIG. 5B, at step 505 the internal references are set to values greater than the limits of the full scale range, and at step 510 a time period is waited for the references to settle. At step 700, the interleaver circuit (e.g., using the pattern generator 170) applies the reference waveform (e.g., a training pattern comprising a pseudo random binary sequence (PRBS) signal with high and low levels as previously specified for the square wave reference waveform) to the analog input of the ADC.

At step 520, the system determines whether the ADC is a single level or two level time interleaved ADC. In embodiments, the information for making this determination, e.g., data defining the type of ADC, is stored in the interleaver circuit and/or the digital gain controller. Accordingly, the determination at step 520 may comprise analyzing such stored data.

In the event the ADC is a single level time interleaved ADC, the process proceeds to step 705, at which step the digital gain controller records a first sample from the ADC. In embodiments, the first sample is a digital code that is output from the ADC (e.g., ADC unit 115) which may correspond to a high or low state of the PRBS when VREGADCP and VREGADCN are supplied to the ADC as the reference voltage. At step 710, the digital gain controller determines whether the sample from step 705 is a high sample (e.g., corresponding to a high state of the PRBS) or a low sample (e.g., corresponding to a low state of the PRBS). In embodiments, a high sample may be defined as any value exceeding the center code value $2^N-1$ and a low sample may be defined as any value not exceeding the center code value. When the sample from step 705 is a high sample, then at step 715 the digital gain controller updates a first average based on the sample obtained at step 705. On the other hand, when the sample from step 705 is a low sample, then at step 720 the digital gain controller updates a second average based on the sample obtained at step 705. The first and second averages calculated at steps 715 and 720 are running averages of a plurality of samples taken from the ADC at step 705 over a number of cycles, and these first and second averages are used in steps 570, 575, 580, . . . , of FIG. 5B in the same manner as described above with respect to FIG. 5A.

In the event the ADC is determined to be a dual level time interleaved ADC at step 520, the process proceeds to step 725 at which the digital gain controller samples the digital output of all of the unit cells (e.g., unit cells 115*a-j*) of the ADC unit. In embodiments, the each of the sample is a digital code that is output from the ADC unit cell which may correspond to a high or low state of the PRBS when VREGADCP and VREGADCN are supplied to the ADC as the reference voltage. At step 730, the digital gain controller determines, for each unit cell, whether its digital output is a high sample (e.g., corresponding to a high state of the PRBS) or a low sample (e.g., corresponding to a low state of the PRBS). In embodiments, a high sample may be defined as any value exceeding the center code value $2^N-1$ and a low sample may be defined as any value not exceeding the center code value. At step 735, the digital gain controller updates the first average using all of the determined high samples from steps 725 and 730. At step 740, the digital gain controller updates the second average using all of the determined low samples from steps 725 and 730. The first and second averages calculated at steps 735 and 740 are running averages of a plurality of samples taken from the ADC at step 725 over a number of cycles, and these first and second averages are used in steps 570, 575, 580, . . . , of FIG. 5B in the same manner as described above with respect to FIG. 5A.

Using a PRBS as the training pattern, instead of a square wave, provides for including a wide range of frequencies which ensures robust reference voltage settings for dynamic range optimization. Also, in an ADC array (e.g., interleaved conversion) configuration, using a PRBS provides for detecting symbol shifts and identifying the beginning (e.g., first conversion) of the array. This is a beneficial for circuits in which several arrays work in parallel (e.g., interleaving of interleavers), as the sub-ADC number in each interleaver is not always a certainty.

Figure 6:
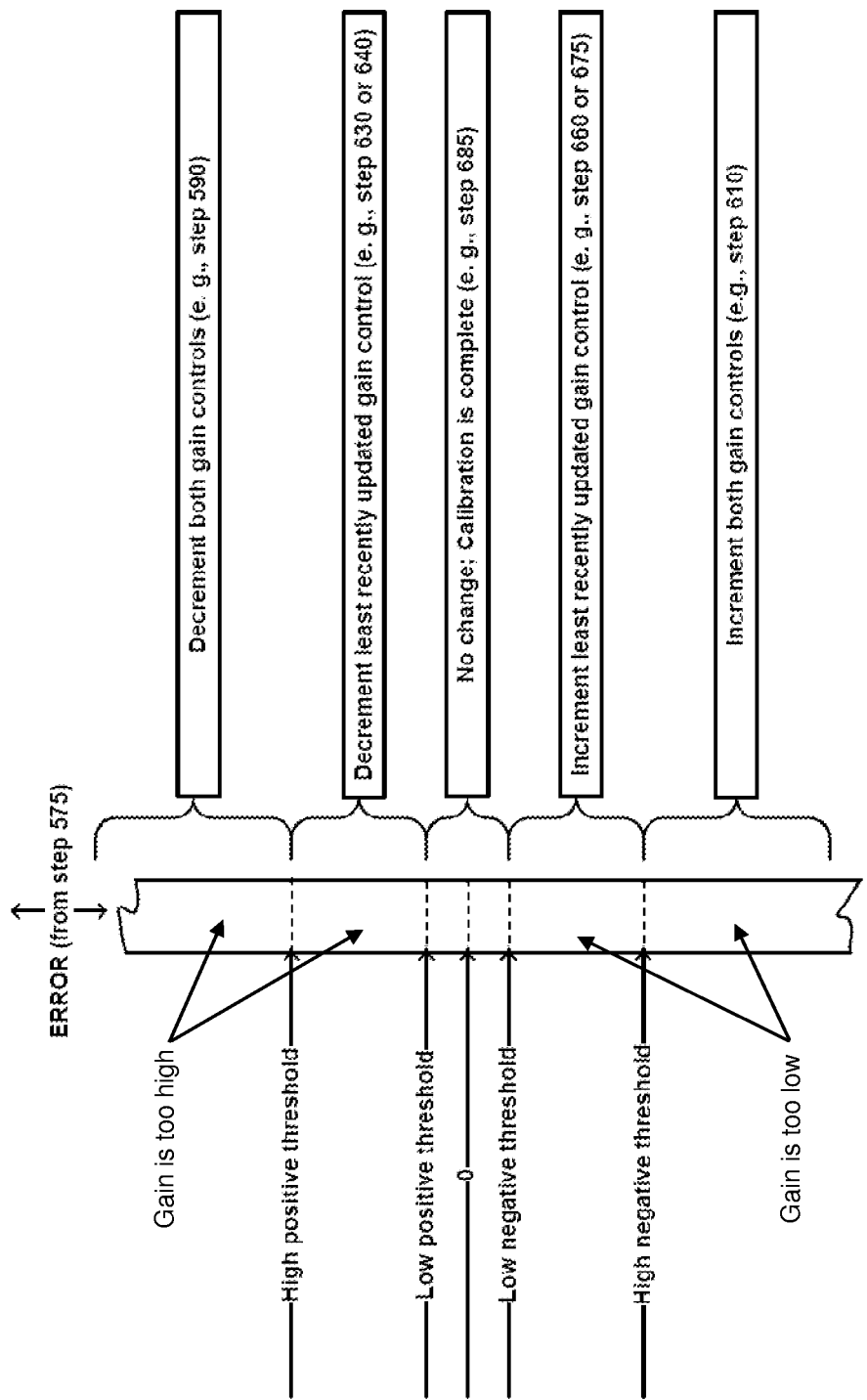
FIG. 6 depicts calibration error ranges in accordance with aspects of the invention.

FIG. 6 diagrammatically depicts the relation between the four thresholds and certain steps of the process of FIGS. 5A and 5B in accordance with aspects of the invention. As depicted in FIG. 6, the comparison of the error to the four threshold values can yield five possible results that are defined along a continuum of possible error values delineated by the four threshold values. For example, when the value of the error (e.g., the error calculated at step 575 of FIGS. 5A and 5B) is greater than the high positive threshold, both gain controls are decremented by the predefined amount (e.g., as described with respect to step 590). When the value of the error is less than the high positive threshold and greater than the low positive threshold, only one gain control is decremented by the predefined amount (e.g., as described with respect to steps 630 and 640).

When the value of the error is less than the high negative threshold, both gain controls are incremented by the predefined amount (e.g., as described with respect to step 610). When the value of the error is greater than the high negative threshold and less than the low negative threshold, only one gain control is incremented by the predefined amount (e.g., as described with respect to steps 660 and 670).

Still referring to FIG. 6, the calibration is complete when the value of the error is less than the low positive threshold and greater than the low negative threshold (e.g., as described with respect to step 680).

As should be understood by one of ordinary skill in the art based on the foregoing description, implementations of the invention may be used to provide an apparatus for a mixed-signal gain optimization loop in a time-interleaved analog-to-digital converter (ADC). The apparatus may include a time-interleaved ADC having a sample rate of 1/T Samples/second (S/s) comprising a plurality of "M" number of ADC blocks each of which further comprises "N" number of ADC unit cells having a sample rate of 1/M*N*T S/s. The apparatus may also include a circuit (e.g., interleaver circuit 150) for providing a reference voltage to be used as a full-scale reference for the N ADC unit cells in each of the M blocks, in which the reference voltage is differential, i.e. represented by the difference between two absolute voltages (e.g., VREFP and VEREFN) taken with respect to a first power supply.

The apparatus may also include a reference voltage element (e.g., DAC 125) capable of digitally adjusting its output, wherein the adjustment can be either equal and opposite to the two absolute voltages or applied exclusively to one or the other of the two absolute voltages. The apparatus may also include a digital calculation element (e.g., digital gain controller 120) for adjusting the digital control of the reference voltage element. The digital calculation element may be operational only during the application of a known analog input signal to the input of the time-interleaved ADC. The known analog input signal (e.g., reference waveform 400) may have two unique and predetermined levels, differing from one another by a known nominal amount.

The digital calculation element may separately calculate: an average of the digital outputs of the even ones of the plurality of N ADC unit cells; an average of the digital outputs of the odd ones of the plurality of N ADC unit cells; a difference between the averages of the odd and even ones of the plurality of N ADC unit cells; and/or an error amount defined by a difference between the difference of averages and a known nominal amount. The digital calculation element may iteratively perform these calculations until the error amount is below a target amount. In an ADC having a single level of time interleaving, the number N of ADC unit cells per ADC block may be N=1.

As should be understood by one of ordinary skill in the art based on the foregoing description, implementations of the invention may be used to provide a method for a mixed-signal gain optimization loop in a time-interleaved analog-to-digital converter (ADC). The method may include applying a known pattern (e.g., reference waveform 400) to the input of a time-interleaved ADC block, the known pattern comprising two levels separated by a known desired fraction of the ADC full scale least significant bit (LSB). The method may also include setting the control of an adjustable reference voltage to a maximum value known to exceed the difference between the two levels in all possible cases. The method may also include calculating a running average of the digital outputs of the even unit cells of the time-interleaved ADC block by: adding the value of the current sample to the average of the previous even cell samples, dividing the result by two, and repeating until sufficient averaging is achieved. The method may also include simultaneously calculating a running average of the digital outputs of the odd unit cells of the time-interleaved ADC block by: adding the value of the current sample to the average of the previous odd cell samples, dividing the result by two, and repeating until sufficient averaging is achieved.

The method may also include determining an error defined by the difference between: (i) the difference of the two running averages and (ii) a target value, and comparing the error to a first threshold. When the error is greater than the first threshold, the method includes modifying the digital control of a reference voltage element to reduce the reference voltages in an equal and opposite fashion.

When the error is greater than a second threshold but smaller than the first threshold, the method includes modifying the digital control of the reference voltage element to reduce the reference voltages in a sequential stepping fashion. The sequential stepping fashion is such that, when the higher of the two reference voltages was changed most recently, the digital control of the reference voltage element is modified to increase the lower of the two reference voltages. Otherwise, when the lower of the two reference voltages was changed most recently, the digital control of the reference voltage element is modified to increase the higher of the two reference voltages.

The method may also include stopping when the error is greater than a second threshold. The method may also include waiting for a predetermined time for the analog voltage references to settle.

The method may also include returning to the step of calculating the running averages of the digital outputs of the even unit cell and the odd unit cells. The number of repeating averages may be adjustable. The averages may be calculated based on a plurality of selected samples rather than as a running average, e.g., the average of the current sample and the previous average. The average may be calculated based on the difference of samples rather than on the samples themselves. The averages may be calculated based on the error, e.g., difference in samples minus the target difference, rather than the samples themselves. The averaging may be omitted.

The method may also include only one reference voltage level (e.g., positive or negative) being adjustable. The predetermined waiting time (e.g., settling time) may be adjustable. The target value may be adjustable. An adjustable tuning amount can be applied to error.

The method may also include the even cell samples being replaced by samples taken from a single ADC block at a first time instance, and the odd cell samples being replaced by samples taken from the same single ADC block at a second time instance. The first and second time instance may be separated in time by one sampling interval.

The method may also include using an alternative training pattern, e.g., a pseudo random binary signal (PRBS) with pseudo randomly alternating high and low levels in combination with an appropriate calculation of the difference between high and low training pattern levels. Independent reference generators may be used for each unit cell, wherein the training pattern is applied as to guarantee a sequence of high and low level samples to each sub unit (e.g. PRBS sequence), and where the principles for single level interleaving is applied to each sub unit.

The method may also include not scaling the references voltages (VREFP and VREFN) to value greater than full scale. The gain adjustment loop may be extended by a capability to increase and/or decrease the reference voltages based on the error.

The method may also include determining offset. The offset may be determined by calculating the difference of the high and low samples to the midpoint and computationally correcting this offset value after conversion.

Figure 7:
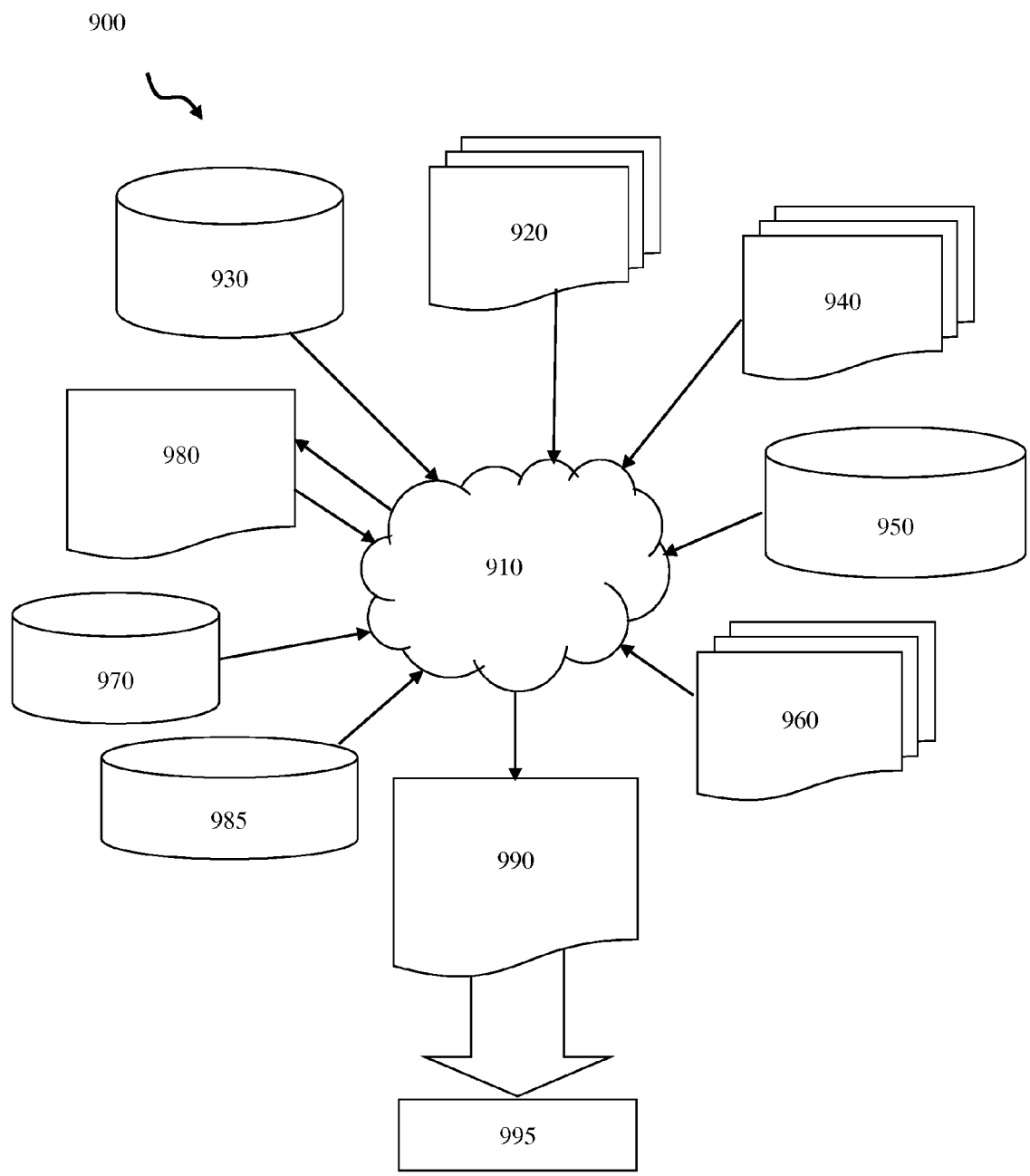
FIG. 7 is a flow diagram of a design process used in semiconductor design, manufacture, and/or test.

FIG. 7 is a flow diagram of a design process used in semiconductor design, manufacture, and/or test. FIG. 7 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1, 2, and 4. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1, 2, and 4. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1, 2, and 4 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1, 2, and 4. In one embodiment, design structure 990 may comprise a compiled, executable HDL simulation model that functionally simulates the devices shown in FIGS. 1, 2, and 4.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 2, and 4. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The corresponding structures, materials, acts, and equivalents of all means or step plus function elements in the claims, if applicable, are intended to include any structure, material, or act for performing the function in combination with other claimed elements as specifically claimed. Moreover, while the invention has been described in terms of embodiments, those of ordinary skill in the art will recognize that the invention can be practiced with modifications and in the spirit and scope of the appended claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A time-interleaved analog-to-digital converter (ADC), comprising:
a plurality of ADC blocks each comprising:
at least one ADC unit configured to convert an analog input to a digital output; and
a digital gain controller configured to adjust a reference voltage of the at least one ADC unit based on a comparison of an actual output of the at least one ADC unit to an expected output of the at least one ADC unit.

2. The time-interleaved ADC of claim 1, further comprising an interleaver circuit and a digital-to-analog converter (DAC), wherein:
the interleaver circuit provides an initial reference voltage to the DAC; and
the DAC generates the reference voltage of the at least one ADC unit by adjusting the initial reference voltage.

3. The time-interleaved ADC of claim 2, wherein the DAC adjusts the initial reference voltage based on at least one control signal from the digital gain controller.

4. The time-interleaved ADC of claim 2, wherein:
the DAC comprises a resistor string; and
the DAC adjusts the initial reference voltage by changing a tap location along the resistor string.

5. The time-interleaved ADC of claim 2, further comprising a voltage regulator between the DAC and the at least one ADC unit, wherein the voltage regulator regulates the reference voltage of the at least one ADC unit.

6. The time-interleaved ADC of claim 2, wherein the interleaver circuit provides samples of a reference waveform to the at least one ADC unit.

7. The time-interleaved ADC of claim 6, wherein the expected output of the at least one ADC unit is based on the reference waveform.

8. The time-interleaved ADC of claim 6, wherein:
the reference waveform has an amplitude that is less than a full scale of the at least one ADC unit; and
the reference waveform is one of a square wave and a pseudo random binary signal (PRBS).

9. The time-interleaved ADC of claim 2, wherein the initial reference voltage is greater than a nominal full scale reference voltage of the at least one ADC unit.

10. The time-interleaved ADC of claim 1, wherein:
the digital gain controller calculates a first average of first digital outputs of the at least one ADC unit;
the digital gain controller calculates a second average of second digital outputs of the at least one ADC unit; and
the actual output is a difference between the first average and the second average.

11. The time-interleaved ADC of claim 1, wherein:
the time-interleaved ADC is a single-level time-interleaved ADC;
the at least one ADC unit comprises only one ADC unit;
the digital gain controller samples a first digital output of the one ADC unit to create a first average;
the digital gain controller samples a second digital output of the one ADC unit to create a second average; and
the actual output is a difference between the first average and the second average.

12. The time-interleaved ADC of claim 1, wherein:
the time-interleaved ADC is a dual-level time-interleaved ADC;
the at least one ADC unit comprises a plurality of ADC units;
the digital gain controller creates a first average from first digital outputs of a first subset of the plurality of ADC units corresponding to even ones of the plurality of ADC units;
the digital gain controller creates a second average from second digital outputs of a second subset of the plurality of ADC units corresponding to odd ones of the plurality of ADC units; and
the actual output is a difference between the first average and the second average.

13. The time-interleaved ADC of claim 1, wherein:
the reference voltage is a differential reference voltage comprising a first reference voltage and a second reference voltage;
the digital gain controller increments both the first reference voltage and the second reference voltage when the comparison yields a first result;
the digital gain controller decrements both the first reference voltage and the second reference voltage when the comparison yields a second result;
the digital gain controller increments only one of the first reference voltage and the second reference voltage when the comparison yields a third result;
the digital gain controller decrements only one of the first reference voltage and the second reference voltage when the comparison yields a fourth result; and
the digital gain controller does not adjust either one of the first reference voltage and the second reference voltage when the comparison yields a fifth result.

14. A calibration circuit for a time-interleaved analog-to-digital converter (ADC), comprising:
a digital gain controller configured to compare an actual output of an ADC unit of the time-interleaved ADC to an expected output of the ADC unit; and
a digital-to-analog converter (DAC) structured to adjust a differential reference voltage for the ADC unit based on:
(i) an initial differential reference voltage received from an interleaver circuit of the time-interleaved ADC, and
(ii) at least one control signal generated by the digital gain controller based on the comparison.

15. A mixed-signal gain optimization loop in a time-interleaved analog-to-digital converter (ADC) apparatus, comprising:
a time-interleaved ADC having a sample rate of 1/T Samples/second and comprising a plurality of M ADC blocks each of which further comprises N ADC unit cells having a sample rate of 1/(M*N*T) Samples/second;
a circuit element configured to provide a reference voltage to be used as a full-scale reference for the N ADC unit cells in each of the M ADC blocks, wherein the reference voltage is a differential analog reference voltage defined by a difference between two absolute voltages taken with respect to a first power supply;
a reference voltage element configured to digitally adjust one or both of the absolute voltages; and
a digital calculation element configured to adjust a digital control of the reference voltage element, wherein:
the digital calculation element is operational during application of a predefined analog input signal to an input of the time-interleaved ADC;
the predefined analog input signal has two unique and predetermined levels differing from one another by a predefined nominal amount; and the digital calculation element separately calculates:
a first average of digital outputs of even ones of the plurality of N ADC unit cells;
a second average of digital outputs of the odd ones of the plurality of N ADC unit cells;
a first difference between the first and second averages; and
a second difference between: the first difference and the predefined nominal amount.

16. A method of gain calibration of a time-interleaved analog-to-digital converter (ADC) apparatus, comprising:
providing a reference voltage to at least one ADC unit of the time-interleaved ADC, wherein the reference voltage is initially greater than a nominal full scale reference voltage range of the at least one ADC unit;
supplying a predefined analog input signal to the at least one ADC unit;
sampling an actual output of the at least one ADC unit generated based on the reference voltage and the predefined analog input signal;
comparing the actual output to an expected output associated with the predefined analog input signal; and
adjusting the reference voltage based on the comparing.

17. The method of claim 16, further comprising iteratively repeating the sampling, the comparing, and the adjusting until a difference between the actual output and the expected output is within a predefined range.

18. The method of claim 16, further comprising performing the steps of claim 17 when the time-interleaved ADC is off-line.

19. The method of claim 16, wherein:
the actual output comprises a difference between first and second running averages of output of the at least one ADC unit that correspond to first and second levels of the predefined analog input signal; and
the comparing is insensitive to offset associated with the at least one ADC unit.

20. The method of claim 19, wherein:
the time-interleaved ADC is a single-level time-interleaved ADC; and
the first and second running averages are based on consecutive digital outputs from the at least one ADC unit.

21. The method of claim 19, wherein:
the time-interleaved ADC is a dual-level time-interleaved ADC;
the at least one ADC unit comprises a plurality of ADC sub-units; and
the first running average is based on digital outputs from a first subset of the plurality of ADC sub-units; and
the second running average is based on digital outputs from a second subset of the plurality of ADC sub-units.

22. The method of claim 16, wherein:
the reference voltage is a differential reference voltage comprising first and second reference voltages; and
the adjusting comprises:
adjusting only one of the first and second reference voltages when the comparison yields a first predefined result; and
adjusting both the first and second reference voltages when the comparison yields a second predefined result.

23. The method of claim 16, wherein the predefined analog input signal comprises a square wave with alternating high and low levels and an amplitude that is less than a full scale of the at least one ADC unit.

24. The method of claim 16, wherein the predefined analog input signal comprises a pseudo random binary signal (PRBS).

25. A method of gain calibration of a time-interleaved analog-to-digital converter (ADC) apparatus, comprising:
providing a reference voltage to at least one ADC unit of the time-interleaved ADC, wherein the reference voltage is initially greater than a nominal full scale reference voltage range of the at least one ADC unit;
supplying a predefined analog input signal to the at least one ADC unit;
determining a first average of first digital outputs of the at least one ADC unit, wherein the first digital outputs correspond to a first level of the predefined analog input signal;
determining a second average of second digital outputs of the at least one ADC unit, wherein the second digital outputs correspond to a second level of the predefined analog input signal;
determining a difference between the first and second averages;
comparing the difference to an expected value for the predefined analog input signal; and
adjusting the reference voltage based on the comparing.

* * * * *